LATCHING DEVICES

Filed July 15, 1966

3 Sheets-Sheet 1

INVENTORS
JOHN P. KOONS
WALTER M. YOUNG
CHARLES R. YUNGKURTH

BY Norman R. Bardales
ATTORNEY

LATCHING DEVICES

Filed July 15, 1966 3 Sheets-Sheet 2

Dec. 24, 1968 J. P. KOONS ET AL 3,418,534
LATCHING DEVICES
Filed July 15, 1966 3 Sheets-Sheet 3
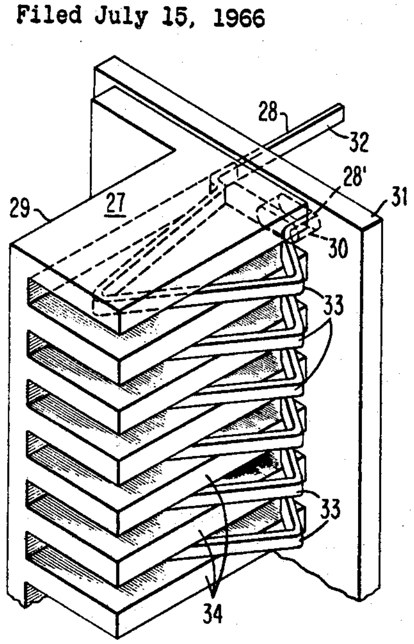
FIG. 4
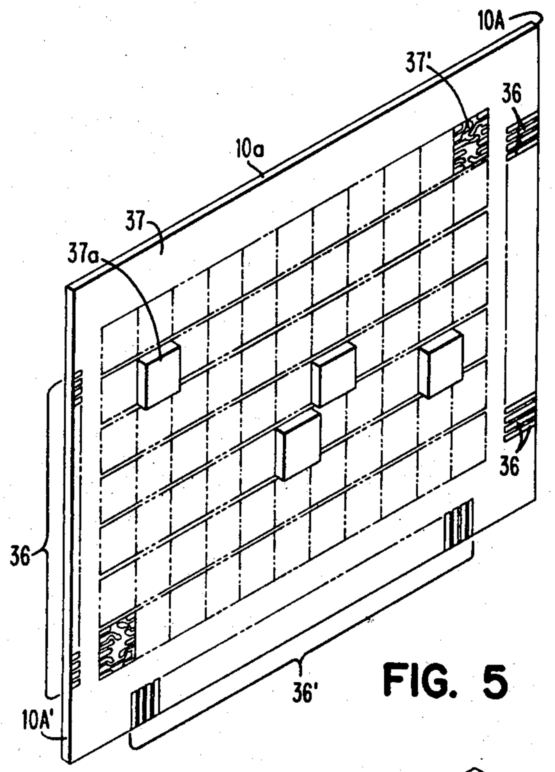
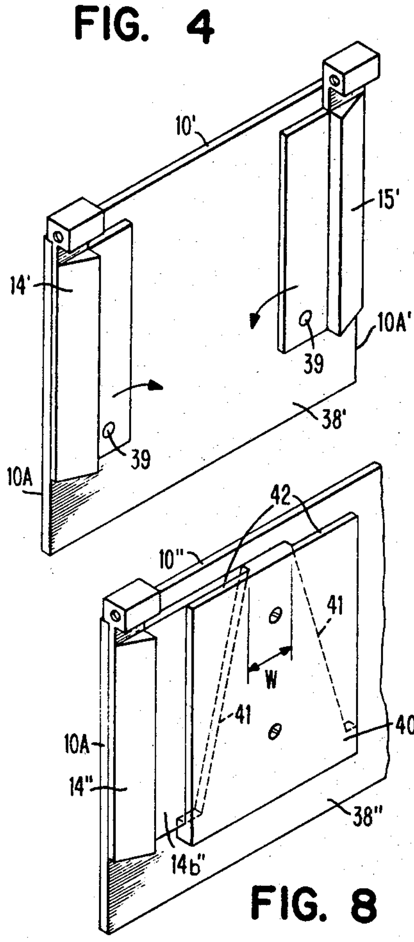
FIG. 7, FIG. 8
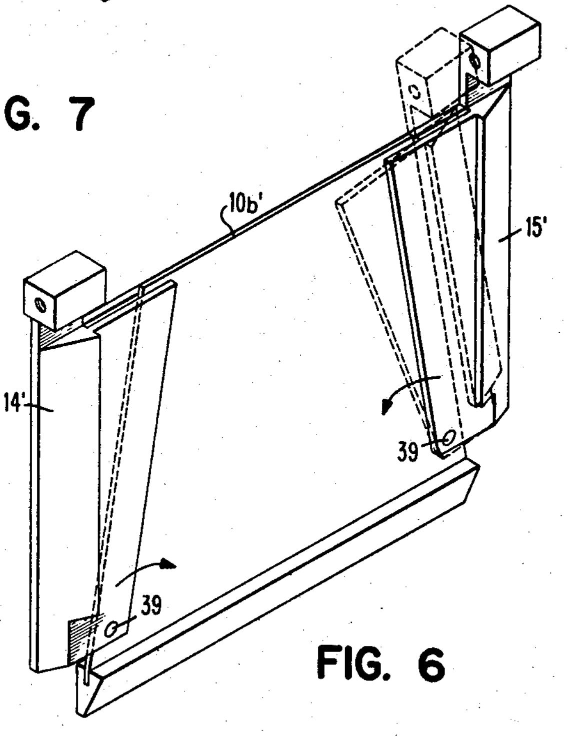
FIG. 6

United States Patent Office 3,418,534
Patented Dec. 24, 1968

3,418,534
LATCHING DEVICES

John P. Koons, Apalachin, and Walter M. Young and Charles R. Yungkurth, Endicott, N.Y., assignors to International Business Machines Corporation, Armonk, N.Y., a corporation of New York Filed July 15, 1966, Ser. No. 565,496
10 Claims. (Cl. 317—101)

ABSTRACT OF THE DISCLOSURE

The latching assembly is comprised of a flat member and receiving means having at least two groove forming members. Two movable wedge-like means are insertable in the grooves of the receiving means. The wedge members are locked in their lowermost positions. The wedge members place portions of the periphery of the flat member in close spatial relationship with the receiving means in proximity of the particular groove-forming member with which it is associated.

This invention relates to latching devices and more particularly to latching devices which lock two bodies in a predetermined interconnection relationship.

Latching devices for connecting two bodies are found in various and diverse applications for providing mechanical, and/or electrical, and/or thermal interconnections. For example, in the electronic packaging art, it is often desirous to make interconnections between the terminals of a single or multi-layer printed circuit board and the contacts of an electrical receptacle. It is usually the objective in these applications to make an electrical, as well as mechanical and/or thermal interconnection.

The board, as is well known to those skilled in the art, is generally part of a modular assembly and carries various constituent electronic components which are interconnected by printed circuit conductors and/or wire jumpers. The components themselves may be of the integrated circuit type and formed as part of the conductive pattern of the board and/or they may be severable components mounted on or within the board in which latter case some or all of the components may be of the conventional or integrated types.

Terminals, which are generally in the form of printed circuit conductors, are provided on the board for interconnection to other modules of the electrical system with which the board is associated. These terminals are generally placed in alignment along the edge of a preselected side of the board. More recently the terminals are now placed along two or more of the sides to provide a greater number of connections and/or to increase the heat transfer surface available for a given number of terminals. In such package circuit arrangements, it has been the practice to provide various means for maintaining the terminals in contacting relationship with the aforementioned receptacle contacts. Generally, in the past, the terminal carrying edge or edges of the board and the receptacle were constructed in such a way so as to act as a plug-in assembly wherein the terminals are held by resilient U-shaped contacts of the receptacle. Still in another type of prior art devices, the terminals of the board were aligned with the contacts of the receptacle and forceably placed into contacting relationship by biasing means such as a spring or cam operated device. However, these prior art methods have often proven to be inadequate to meet the high density packaging requirements for today's increasing number of components mounted on the board, and consequent increase in the number of terminal connections, due to the advances in microelectronic packaging techniques. For example, because of the increased number of terminal connections and the demand for a more positive interconnection, the interconnections of the prior art printed circuit assemblies have been found inadequate and unreliable in environments where there is considerable vibration or shock, such as in a space vehicle launching. Under such environmental conditions, it is often found that one or more of the terminal connections of the board would often be rendered completely or partially out of register with its receptacle contacts causing a concomitant complete or partial failure in the associated electronic system of which it is a part. In addition, the use of cam operated devices of the prior art causes an increase in the overall dimensions of the modular assembly as a result of the necessity to provide additional space to manipulate or operate the associated cam. More specifically, in these types of prior art devices, the motion or direction of the cam operated member was in a plane normal to the plane of the board thus requiring additional spacing between the boards to allow for movement of the cam and/or cam operated member when the device was actuated into a locked or unlocked condition.

Still in another known device of the prior art, a wedge member was provided which, when actuated in a given plane, locked the printed circuit card to the receptacle such that the plane of the printed circuit card was normal to the plane of the direction of movement of the wedge. In such a device, it was necessary to provide a substantial increase in the spacing between the boards in order to accommodate or to allow for the movement of the wedge. Furthermore, in this known device, the board could be locked along only one of its edges.

The object of this invention is to provide a latching device which is easily constructed and/or easily operated.

Another object of this invention is to provide a latching device which is compact, rugged, and simple.

Still another object of this invention is to provide a latching device for interconnecting a printed circuit card to a receptacle.

Still another object of this invention is to provide a latching device for a printed circuit card which provides good mechanical, electrical, and/or thermal connections.

Still another object of this invention is to provide a latching device for a printed circuit card interconnection assembly which is readily fabricated in modular form.

Accordingly, the latching device of this invention features, inter alia, a flat member means. A receiving means having at least two groove-forming members is provided such that the flat member means is received within the two grooves so formed along two of its predetermined edges. At least two wedge members are movably mounted on the flat member means and their direction of movement is in a plane parallel to the plane of the flat member means. Each of the wedges members is moved in a direction towards a particular one of the aforementioned predetermined edges of the flat member means and into the respective groove-forming member which is associated with the particular edge. As a result, each of the wedge members places a portion of the periphery of the flat member means in a predetermined spatial relationship with the receiving means in proximity of the groove-forming member with which it is associated when that particular wedge member is in its associated groove.

As another feature of this invention, predetermined parts of the aforementioned portions of the periphery of the flat member means comprises a plurality of prined circuit terminal conductor members. In addition, each of the groove-forming members comprises an electrical receptacle having plural contacts. The terminal conductor members are placed in intimate contacting relationship with the contacts when the wedge members are placed in their respective grooves.

When the principles of the present invention are employed for locking a printed circuit card in a receptacle, the depth or thickness of the assembly is considerably reduced and/or interconnections may be made along two or more edges of the printed circuit card.

The foregoing and other objects, features and advantages of the invention will be apparent from the following more particular description of preferred embodiments of the invention, as illustrated in the accompanying drawings.

In the drawings:

FIG. 4 is an enlarged partial view of the electrical receptacle shown in FIG. 1;

FIG. 5 is a perspective view illustrating the front face of the printed circuit card of FIG. 1;

Figure 9:
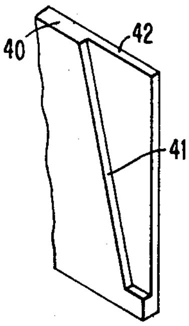

FIGS. 6, 7, and 8 are perspective views of alternative embodiments of the present invention; and FIG. 9 is a partial view of the guide means 40 shown in FIG. 8 as seen from the reverse side thereof.

In the figures, like elements are designated with similar reference numbers.

Figure 1:
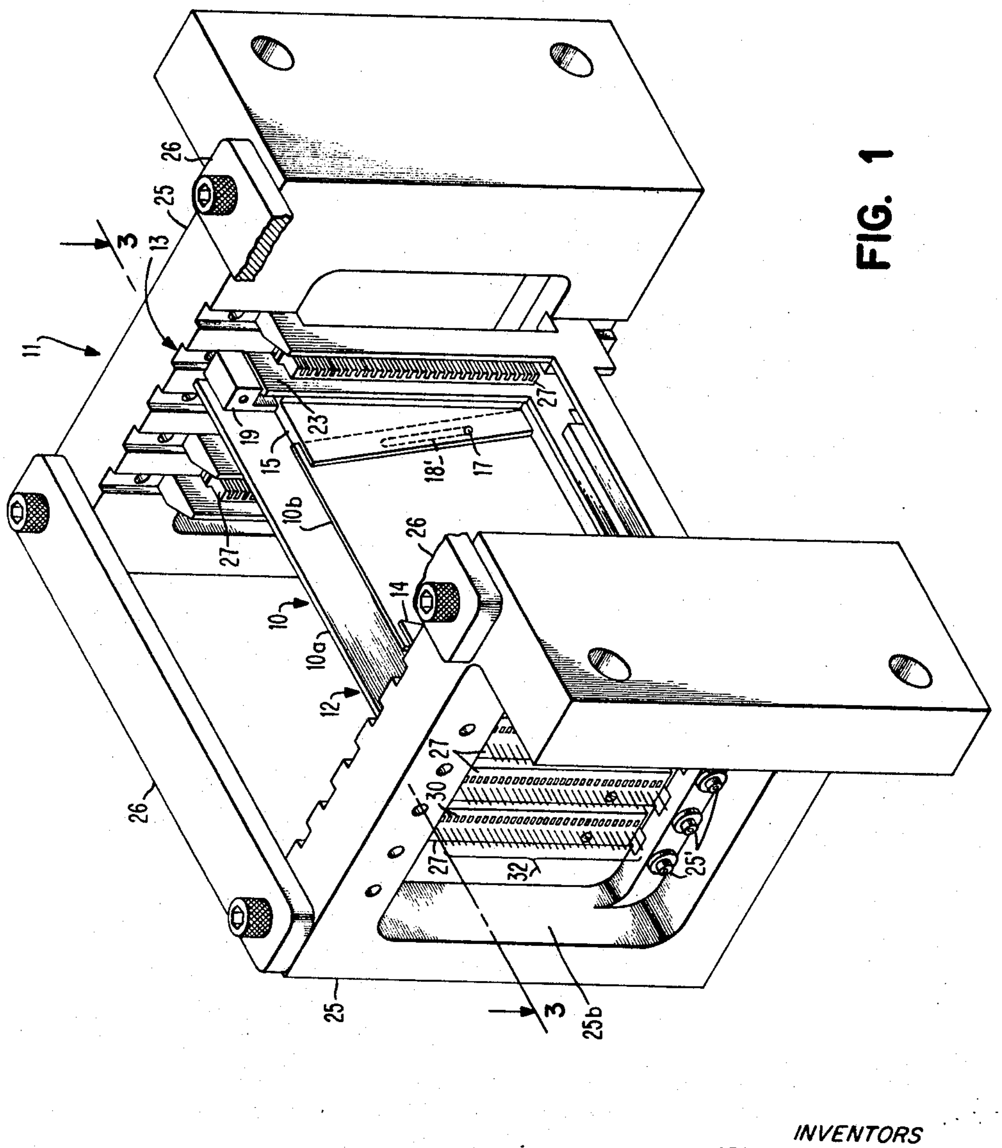
FIG. 1 is a perspective view illustrating an embodiment of the present invention.
Figure 2:
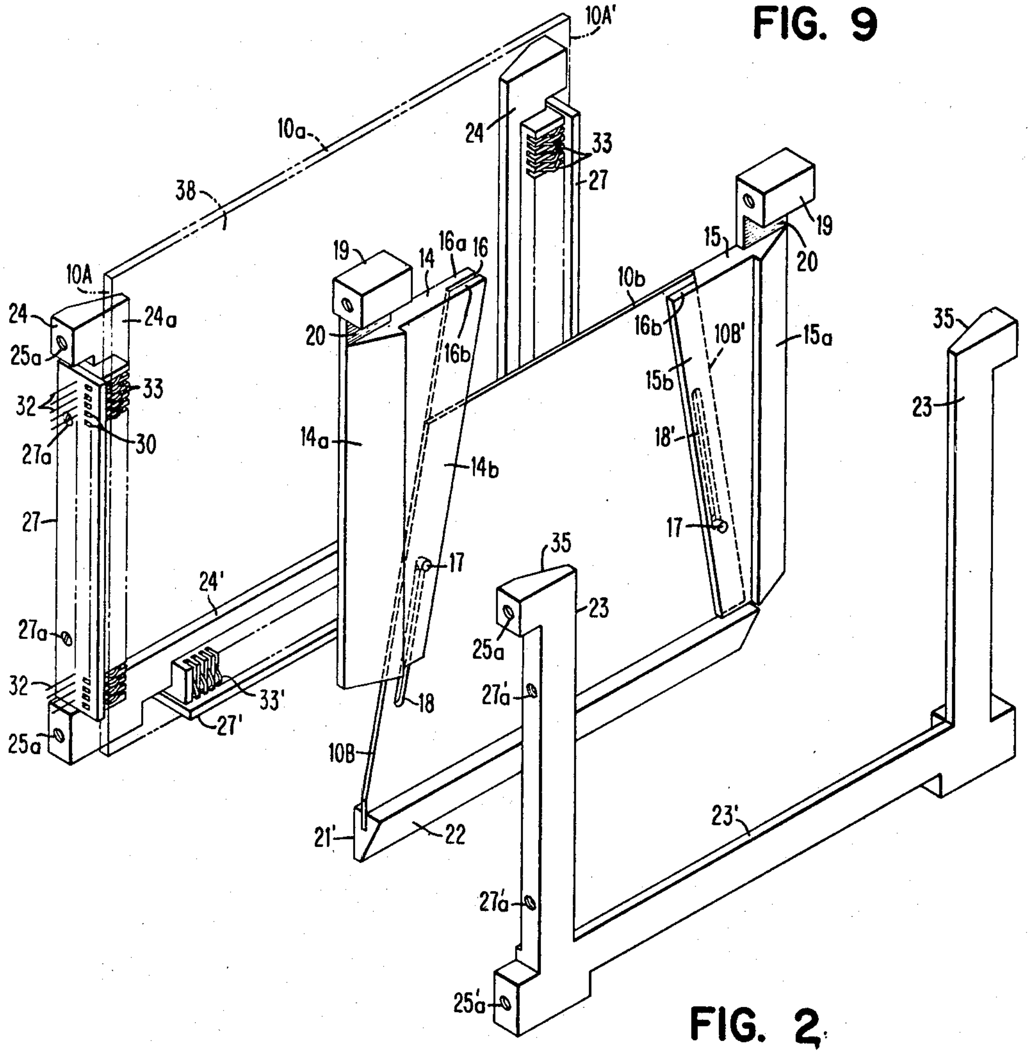
FIG. 2 is an exploded perspective view illustrating in greater detail the embodiment of FIG. 1.

In brief, referring to FIGS. 1 and 2, the latching device of this invention broadly comprises a flat member means and a receiving means generally indicated by the reference numerals 10 and 11, respectively. Receiving means 11 has at least two groove-forming members generally indicated at reference numerals 12 and 13 and within which the two side edges, e.g., edges 10A and 10A′, of the member illustrated in FIGS. 1 and 2, the flat member means comprises two severable sub-members 10*a* and 10*b*. Sub-member 10*b* carries two movable wedge members 14, 15, whose respective directions of movement are in a plane which is parallel to the plane of the flat member means 10. Sub-members 10*a* and 10*b* are inserted within the grooves formed by members 12 and 13 with the wedge members 14, 15 in the upright or unlocked position, as indicated by the position of wedge member 14, FIG. 2. Thereafter, the wedge members 14, 15 are actuated to their lower or locked positions, as indicated by the position of wedge member 15, FIG. 2, which causes them to move outwardly towards the aforementioned side edges 10A, 10A′, respectively, and in a plane parallel to the plane of the flat member means 10. As a result, each of the wedge members 14, 15 when moved into the groove, places a portion of the periphery of the sub-member 10*a* in close spatial relationship with the receiving means 11 in proximity of the particular groove-forming members 12, 13 with which it is associated.

Referring now in greater detail to FIGS. 1–5, the latching device of the invention is preferably embodied in a device for locking a printed circuit card to an electrcal receptacle. Accordingly, the sub-member 10*a* of flat member means 10 in the embodiment of FIG. 1 is a printed circuit card, shown in greater detail in FIG. 5, and the severable sub-member 10*b* is an isosceles trapezoidal flat plate which carries the movable wedge members 14 and 15, c.f. FIG. 2. Each of the wedge members 14, 15 has a wedge face 14*a*, 15*a*, FIG. 2. The apices of the wedge portions of members 14 and 15 are parallel to edges 10A, 10A′, respectively. An extension 14*b*, 15*b*, FIG. 2, is provided at each of the bases of the wedge portions of members 14, 15 and has a planar configuration in the form of an inverted truncated right angle triangle. At each of the edges of the extensions 14*b*, 15*b*, which edges correspond to the hypotenuse of the aforementioned triangle, there is provided a groove, c.f. groove 16 of extension 14*b*, FIG. 2. The groove 16 is parallel with the aforementioned hypotenuse edge and the side walls 16*a*, 16*b* formed thereby straddle an inclined side edge 10B, 10B′ of the trapezoidal plate 10*b*. The edges 10B, 10B′ are also parallel to the hypotenuse side or edge of the extensions 14*b* and 15*b*, respectively. As a result when members 14*b*, 14*b* are in movement, their respective vertical axes remain normal to the base of the trapezoidal plate 10*b* and parallel to the edges 10A, 10A′. Across each groove 16 there is provided a pin 17 which is affixed at its ends to the side walls 16*a*, 16*b*, FIG. 2, formed by the groove 16. The pin 17 passes through the elongated apertures 18, 18′ of member 10*b*, the latter apertures being parallel ot the edges 10*b*, 10*b′*, respectively. Each of the members 14, 15 is provided with a handle or lug 19 by means of which the operator may manipulate the movement of the members 14, 15 into their respective locked and unlocked positions. Lugs 19 are affixed to the members 14, 15 by extensions 20. Optionally, a fixed wedge member 21 having a wedge face 22 may also be affixed to the base of the trapezoidal plate 10*b* for purposes hereinafter discussed.

Receiving means 11 in the preferred embodiment comprises groove-forming members 12, 13 for guiding and receiving the edges 10A, 10A′ of the printed circuit card 10*a*, as well as the edges in proximity of the respective apices of members 14, 15. As shown in greater detail in FIG. 3, each groove-forming member, e.g., member 12, has a pair of identical elongated sub-members 23, 24 which are aligned and mounted to one of the frames 25, FIG. 1. For example, as shown in the drawings, the left sub-members 23, 24 of FIG. 2 are provided with a pair of threaded upper and lower holes 25*a*, FIG. 2, and are attached to the left frame 25, FIG. 1, by suitable bolts, such as the bolts 25′ shown in FIG. 1. For purposes of clarity only the bolts 25′ which pass through the left frame 25 of FIG. 1 and which are fastened to the lower holes 25*a* of the left sub-members 23, 24 of FIG. 2 are illustrated. It is to be understood, however, that the left sub-members 23, 24 of FIG. 2 are similarly attached to the left frame 25 of FIG. 1 by bolts, not shown, coacting with the upper holes 25*a* thereof and the right sub-members 23, 24 of FIG. 2 are likewise attached to the right frame of FIG. 1 by suitable bolts, not shown, coacting with associated upper and lower threaded holes, not shown, provided thereon. Frames 25 are constructed with a mirror symmetry with with respect to each other and are maintained in a fixed spatial relationship with each other by sutable means such as cross members 26, FIG. 1. For purposes of clarity, frame 25 is illustrated in phantom outlined in FIG. 3 and the forward member 26 is partially broken away in FIG. 1. Each of the sub-members 23, 24, e.g., the left sub-member 24 of FIG. 2, has mounted on the horizontal surface 24*a*, FIGS. 2 and 3, an electrical receptacle 27 such as, for example, by the screws 27*a* which are adapted to coact with appropriate threaded holes, e.g., holes 27*a′* of left sub-member 23 shown in FIG. 2, that are provided for this purpose.

Electrical receptacle 27, as shown in greater detail in FIG. 4, has a plurality of resilient V-shaped conductive members 28 which are mounted on an insulating body 29. The body 29 is formed into a plurality of shelf-like compartments in each of which there is located the V-shaped portion of one of the conductive members 28, the end 28′ thereof being inserted and maintained in an aperture 30 provided in the insulated base 31 of the member 27. The other end 32 of the conductive member 28 passes through another aperture, not shown, provided in the base 31, and it is to this last mentioned end 32 to which is coupled the electrical conductor(s), which in turn is interconnected to the other parts of the associated electrical system, not shown, a suitable aperture, e.g. aperture 25*b* of FIG. 1, being provided in the frames 25 for this purpose. As shown in FIG. 4, a part 33 of the V-shaped portion of member 28 protrudes past the edges 34 of the shelf-like compartment of member 27 and acts as one of the contacts of the electrical receptacle.

Figure 3:
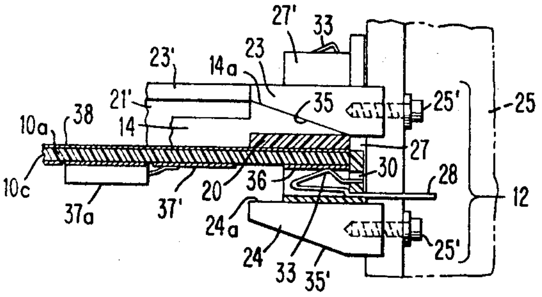
FIG. 3 is a partial cross-sectional view taken along the line 3—3 of FIG. 1 and as seen from the back thereof, which illustrates one of the wedge members thereof in a locked position in its associated groove-forming member.

Returning now to FIG. 3, sub-member 23 which is also affixed to the frame 25 as aforementioned, is provided with a mating face 35 which is compatible to the contour and inclination of the face, e.g. face 14*b*, of the associated wedge member. As shown in FIGS. 1 and 3, mounted adjacent to sub-member 23 is another receptacle 27' which is adapted to coact with another printed circuit board of a similar adjacent latching device, not shown. Similarly, sub-member 24 has a similar face 35' adapted to coact with the wedge member of still another similar latching device when placed adjacent thereto. As is apparent from the aforedescribed construction, the latching device of the invention is readily adaptable to modular construction and is particularly useful for a modularized printed circuit card interconnection assembly.

In operation, as previously mentioned, the printed circuit card 10*a* is inserted simultaneously with, and/or prior to the insertion of, the sub-member 10*b* with the movable wedge members 14, 15 in their upright or unlocked positions.

As shown in FIG. 5, the printed circuit board 10*a* is provided with terminals or conductive lands indicated generally by the reference numeral 36. Each of the lands 36 is fabricated as part of the printed circuit conductive pattern, partially shown at 37'. By way of example only, the board 10*a* comprises an insulating base 10*c* with the aforementioned conductive pattern being carried on one surface 37 and a conductive layer being carried on the other surface 38, c.f. FIGS. 3 and 5. The conductive layer acts as a ground for the circuitry, such as for example, the module 37*a*, of the board 10*a* in a manner well known to those skilled in the art. The lands 36 are disposed adjacent to the edges 10A, 10A' of card 10*a* and each land is aligned and in register with a predetermined one of the protruding contacts 33 of the electrical receptacle 27 when inserted into its associated groove-forming member. The board 10*a* is inserted in the receiving means 11 with the lands 36 facing the contacts 33. With the sub-member 10*b* installed within the groove-forming members 12, 13 and adjacent to the reverse side 38 of the board 10*a*, the wedge members 14, 15 are actuated in a downward movement. This action causes the wedges to move also in a lateral direction as they slide along the edges 10B, 10B' thereby placing the respective wedge faces 14*b*, 15*b* in contacting relationship with the mating faces 35 of the associated stationary left and right sub-members 23 of FIG. 2. As a result, in the locked position each of the lands 36 of the board 10*a* is placed in intimate contacting relationship with one of the contacts 33 of the electrical receptacle 27. As shown in FIG. 3, the contact 33 is retracted inwardly towards its associated shelf-like compartment but due to its spring-like configuration the contact 33 is resiliently maintained in contacting relation with the land 36. In addition, the wedge members are placed in intimate contact relationship with the sub-members 23, as well as the printed circuit board.

If the optional fixed wedge member 21 is provided, then additional sub-members 23', 24', FIG. 2, are provided, the last mentioned one of which carries a receptacle 27' and the other of which has a compatible mating face, not shown, adapted to coact with the wedge face 22 of wedge member 21. Under these conditions, additional lands 36', FIG. 5, would be provided on the bottom edge of the card 10*b* for coaction with the contacts, e.g. contact 33', of receptacle 27'. The operation of the device is similar as before except that the initial downward insertion of the member 10*b* forces the wedge member 22 to be properly seated and locked in the groove-forming member comprised by the sub-members 23', 24' and receptacle 27' of FIG. 2. Here again, it should be noted that the movement of the wedge member 21 is in the plane which is parallel to the plane of the board 10*a*. Thereafter, the movable wedge members 14, 15 are actuated to their locked position. For removal, the movable wedge members 14, 15 are moved in an upward direction and the member 10*b* lifted or withdrawn from the groove-forming members via lugs 19. As before, the sub-member 23' is also adapted to carry an electrical receptacle, not shown, and the sub-member 24' has a compatible wedge face, not shown, so as to coact with other similar latching devices placed adjacent thereto. The left and right sub-members 23 of FIG. 2 and/or the sub-member 23', and as well as the left and right sub-member 24 and/or sub-member 24', may be constructed as compatible units as shown in FIG. 2 or as severable parts as is obvious to those skilled in the art.

In FIGS. 6 and 7, the wedge members 14, 15 are shown as being pivotable about fixed pivots 39 in lieu of the sliding wedge members of the embodiment of FIG. 1. In FIG. 6, the wedge members 14', 15' are attached to a severable plate 10*b'*, which is similar to the embodiment illustrated in FIG. 1. Alternately, the wedge members 14', 15' may be pivotally attached directly to the surface 38' of printed circuit card 10' as shown in FIG. 7, in which case the need of a severable plate, such as the plates 10*b* and 10*b'* of FIGS. 1 and 6, respectively, is obviated. As shown in FIG. 6, the wedge members 14' and 15' are illustrated in their locked positions, wedge members 15' being also illustrated in phantom outline to demonstrate the open or unlocked position thereof. Again, the movement of the wedge members 14', 15' of FIGS. 6, 7 occurs in a plane which is parallel to the plane of the board or printed circuit card.

In FIG. 8 is partially shown still another alternative embodiment of the invention. The flat member 10'' is illustrated therein as an integral member and is preferably embodied as a printed circuit card which has mounted on the appropriate outer ground surface 38'' a guide means such as member 40. The latter has a pair of inclined guide tracks 41, as shown in greater detail in FIG. 9. The wedge members, only member 14'' of which is shown in FIG. 8 for sake of clarity, is provided with an extension, e.g. extension 14*b''*, and is provided with a compatible inverted inclined edge which is adapted to be placed adjacent to one of the tracks 41. The extension, e.g. extension 14*b''*, is inserted between the groove formed by the track 41 and wall 42 of member 40 and the surface 38'' of the means 10''. In operation, each of the wedge members, e.g. member 14'', slides along its associated track 41 and when in the lower position, e.g. as shown by the position of member 14'' in FIG. 8, locks means 10'' to the respective groove, not shown, of the associated receiving means, not shown. Sufficient clearance W is provided if simultaneous insertion, as well as withdrawal, operations of the wedge members is desired. Again, the movement of the wedge members is in a plane parallel to the plane of the flat member means.

By maintaining the movement of the wedge members in a plane parallel to the plane of the flat member means, the latching device of the present invention is fabricated in a relatively compact manner and the assembly is particularly adaptable to modular construction. Furthermore, the device provides a wedging force which is uniformly distributed along two or more edges of the printed circuit card thereby enhancing the electrical and/or mechanical and/or thermal interconnections. By judiciously selecting the pressures exerted by the wedge members, and/or the interface area between the wedge face of the wedge member and the mating face of the elongated sub-member coacting therewith, these interconnections may also be further enhanced as is well known to those skilled in the art. Furthermore, by constructing the wedge members, the elongated sub-members coacting therewith, and/or the plate by which they are carried with a material, such as aluminum for example, a good electrical and thermal conductivity, the device provides an additional and substantial heat transfer means for radiating the heat generated by the electronic components of the printed circuit board, as well as enhancing the means for grounding the circuitry of the card. For example, as shown in FIG. 3, the wedge member 14 in the locked position is placed in a firm contacting relationship with the card 10*a* along its surface adjacent thereto and with the frame 25 via the mating face 35 of sub-member 23 and its wedge face 14*a*. Thus, the wedge members coact to provide a good ground connection and a good thermal transfer path for the heat generated by the components carried by the board to the frame 25. Furthermore, in those embodiments where the wedge carrying plates is a severable member, the heat transferring characteristics of the device is further enhanced due to the large radiating area provided by the plate which acts as an additional heat sink for the assembly.

It is to be understood that while the invention is illustrated in the drawings in a particular and a preferred symmetrical configuration that other configurations as well as asymmetrical ones may be employed in practicing the principles of our invention. Thus, for example, while the invention is illustrated in an embodiment employing rectangular shapel flat members or cards, the invention may be practiced with members or printed circuit cards or other configurations such as a triangle or other polygon configurations such as pentagon, hexagon, octagon, etc. ones to mention a few and in addition two or more movable wedge members may be employed in association with two or more sides of the member or card. Thus, while the invention has ben particularly shown and described with reference to preferred embodiments thereof, it will be understood by those skilled in the art that the foregoing and other changes in form and details may be made therein without departing from the spirit and scope of the invention.

What is claimed is:

1. A latching assembly comprising:

flat member means having plural edges;

receiving means having at least two groove-forming members, each of said groove-forming members receiving in the respective groove formed thereby a mutually exclusive predetermined one of said plural edges of said flat member means; and at least two movable wedge-like means carried by said flat member means, each of said wedge-like means being movable in a respective direction towards one of said predetermined edges and into the groove associated therewith, the movement of said wedge-like means occurring in a plane which is substantially in parallel relationship with the plane of said flat member means, and each of said wedge-like means in its associated grove placing a predetermined portion of the periphery of said flat member means in a predetermined spatial relationship with said receiving means in proximity of the grove-forming member with which it is associated.

2. A latching assembly according to claim 1 wherein said wedge-like means are slidably mounted for said movement on said flat member means.

3. A latching assembly according to claim 1 wherein said wedge-like means are pivotably mounted for said movement on said flat member means.

4. A latching assembly according to claim 1 wherein:

predetermined parts of the aforementioned portions of the periphery of said flat member means comprises a plurality of printed circuit terminal conductor members;

each of said groove-forming members further comprising an electrical receptacle, each of said receptacles having plural contacts, said wedge-like means in their respective grooves placing the terminal conductor members in intimate contact with the contacts of said receptacles to provide said predetermined spatial relationship.

5. A latching assembly according to claim 1 wherein said flat member means comprises first and second severable flat sub-members, said wedge-like means being pivotably mounted for said movement on one of said sub-members.

6. A latching assembly according to claim 1 wherein said flat member means comprises first and second severable flat sub-members, and said wedge-like means are slidably mounted for said movement on one of said sub-members.

7. A latching assembly according to claim 6 wherein:

the other of said flat sub-members comprises a printed circuit board, said board having a plurality of printed circuit terminal conductor members, said terminal conductor members comprising predetermined parts of the aforementioned portions of the periphery of said flat member means;

each of said groove-forming members further comprising an electrical receptacle, each of said receptacles having plural contacts;

said wedge-like means in their respective grooves placing the terminal conductor members in intimate contact with the contacts of said receptacles to provide said predetermined spatial relationship.

8. A latching assembly having substantially identical adjacent modular units, each of said modular units comprising:

flat member means having plural edges;

receiving means having at least two groove-forming members, each of said groove-forming members receiving in the respective groove fromed thereby a mutually exclusive predetermined one of said plural edges of said flat member means; and at least two movable wedge-like means carried by said flat member means, each of said wedge-like means having a wedge surface and being movable in a respective direction towards one of said predetermined edges and into the groove associated therewith, the movement of said wedge-like means occurring in a plane which is substantially in parallel relationship with the plane of said flat member means, and each of said wedge-like means in its associated groove placing a predetermined portion of the periphery of said flat member means in a predetermined spatial relationship with said receiving means in proximity of the groove-forming member with which it is associated;

each of said groove-forming members further comprising a pair of elongated parallel aligned members, each of said elongated members having first and second surfaces for said receiving of the associated predetermined edge of the flat member means therebetween, said first surface being substantially parallel to the plane of the flat member means received therein and said second surface being inclined thereto at an angle compatible to the angle of the wedge surface of the wedge-like means carried thereby, said first surface of one of said elongated members coacting with the portion of the periphery of the flat member means received therein and the second surface of the other elongated member coacting with the wedge surface of the wedge-like member carried thereby, the second surface of said one elongated member being adapted to coact with the wedge surface of the wedge-like means carried by another flat member means received by the adjacent modular unit thereto, and the first surface of said other elongated member coacting with a predetermined part of the portion of the flat member means received by the adjacent different modular unit thereto.

9. A latching assembly according to claim 8 wherein:

predetermined parts of the aforementioned portions of the periphery of each of said flat member means comprises a plurality of printed circuit terminal conductor members, and said first surface of each of said elongated members comprises an electrical receptacle, each of said receptacles having plural contacts, said wedge-like means in their respective grooves placing the terminal conductor members in intimate contact with the contacts of said receptacles to provide said predetermined spatial relationship.

10. A latching assembly according to claim 8 wherein:

each of said flat member means comprises first and second severable flat sub-members and having its associated said wedge-like means slidably mounted for said movement on one of said sub-members, the other of said sub-members comprising a printed circuit board;

each of said boards having a plurality of printed circuit terminal conductor members, said terminal conductor members comprising predetermined parts of the aforementioned portions of the preiphery of said flat member means; and said first surface of each of said elongated members comprising an electrical receptacle, each of said receptacles having plural contacts, each of said wedge-like means in their respective grooves placing the terminal conductor members of the associated board in intimate contact with the contacts of the receptacle associated therewith to provide said predetermined spatial relationship.

References Cited

UNITED STATES PATENTS 2,976,510 3/1961 Blain ------------ 317—101 X
3,341,801 9/1967 Brookman et al. ------ 339—18

LARAMIE E. ASKIN, *Primary Examiner.*

J. R. SCOTT, *Assistant Examiner.*